(12) United States Patent
Madge

(10) Patent No.: US 6,476,631 B1
(45) Date of Patent: Nov. 5, 2002

(54) DEFECT SCREENING USING DELTA VDD

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/897,828

(22) Filed: Jun. 29, 2001

(51) Int. Cl.[7] .............................................. G01R 31/26
(52) U.S. Cl. ...................... 324/765; 324/158.1; 702/117
(58) Field of Search ................................ 324/763, 765, 324/759, 158.1; 702/81–84, 117–122

(56) References Cited

U.S. PATENT DOCUMENTS

| | | | |
|---|---|---|---|
| 5,386,189 A | * | 1/1995 | Nishimura et al. ...... 324/158.1 |
| 5,804,960 A | * | 9/1998 | El Ayat et al. ............ 324/158.1 |
| 5,864,566 A | * | 1/1999 | Sanada ........................ 324/765 |
| 6,104,985 A | * | 8/2000 | Sowards ..................... 324/73.1 |

* cited by examiner

*Primary Examiner*—Michael Sherry
*Assistant Examiner*—Tung X Nguyen

(74) *Attorney, Agent, or Firm*—Luedeka, Neely & Graham, P.C.

(57) ABSTRACT

A method for testing a series of functional blocks within an integrated circuit. Each of the functional blocks in the series is tested to determine a minimum parameter value and a maximum parameter value associated with each of the functional blocks. A minimum parameter delta value is calculated for each of the functional blocks in the series. The minimum parameter delta value is the minimum parameter value associated with a given one of the functional blocks subtracted from the minimum parameter value for a functional block immediately following the given one of the functional blocks in the series. A maximum parameter delta value is also calculated for each of the functional blocks in the series. The maximum parameter delta value is the maximum parameter value associated with the given one of the functional blocks subtracted from the maximum parameter value for the functional block immediately following the given one of the functional blocks in the series. The minimum parameter delta value is compared to a minimum parameter delta value tolerance limit and the maximum parameter delta value is compared to a maximum parameter delta value tolerance limit. The integrated circuit is selectively binned based at least in part on whether the minimum parameter delta value or the maximum parameter delta value violates the delta value tolerance limits.

20 Claims, 2 Drawing Sheets

DEFECT SCREENING USING DELTA VDD

FIELD

This invention relates to the field of integrated circuit testing. More particularly, this invention relates to detecting defects within functional blocks of integrated circuits.

BACKGROUND

A number of defects can affect the operation of integrated circuits. Of these, delay faults and resistive defects are two of the most difficult defects to detect during quality assurance testing. That these two defects are also among the highest contributors to reliability failures and customer returns compounds the problems associated with delay faults and resistive defects.

Current methods of testing for these types of defects include functional testing of each functional block to a single low supply voltage specification value and a single high supply voltage specification value. In other words, the functional blocks are tested for proper operation at a predetermined low supply voltage value, and are also tested for proper operation at a predetermined high supply voltage value. However, these methods do not allow for comparison of supply voltage values between functional blocks. Also, by not finding the specific supply voltage limits for a given functional block, it is difficult to identify statistical outliers using present methods.

What is needed, therefore, is an improved testing method for defects such as delay faults and resistive defects.

SUMMARY

The above and other needs are met by a method for testing a series of functional blocks within an integrated circuit. Each of the functional blocks in the series is tested to determine a minimum parameter value associated with each of the functional blocks, and each of the functional blocks in the series to tested to determine a maximum parameter value associated with each of the functional blocks.

A minimum parameter delta value is calculated for each of the functional blocks in the series. The minimum parameter delta value is the minimum parameter value associated with a given one of the functional blocks subtracted from the minimum parameter value for a functional block immediately following the given one of the functional blocks in the series.

A maximum parameter delta value is also calculated for each of the functional blocks in the series. The maximum parameter delta value is the maximum parameter value associated with the given one of the functional blocks subtracted from the maximum parameter value for the functional block immediately following the given one of the functional blocks in the series.

The minimum parameter delta value for a given functional block is compared to a minimum parameter delta value tolerance limit. Likewise, the maximum parameter delta value is compared to a maximum parameter delta value tolerance limit. The integrated circuit is selectively binned based at least in part on whether the minimum parameter delta value for any of the functional blocks violates the minimum parameter delta value tolerance limit. Similarly, the integrated circuit is binned based at least in part on whether the maximum parameter delta value for any of the functional blocks violates the maximum parameter delta value tolerance limit.

By testing each functional block to failure, both for a minimum parameter value and a maximum parameter value, the integrated circuit can be screened for statistical outliers that might normally pass a functional test at a predetermined low specification limit and a predetermined high specification limit, but which might fail in actual use over a period of time.

In one embodiment of the testing method, the minimum parameter delta value tolerance limit and the maximum parameter delta value tolerance limit are absolute limits, or in other words, predetermined specification limits. However, in a preferred embodiment, the minimum parameter delta value tolerance limit and the maximum parameter delta value tolerance limit are statistically calculated limits, based at least in part on the data collected from the functional blocks over time. Thus, as the intrinsic minimum or maximum parameter values increase or decrease due to process variation or other variables, there will not tend to be excessive yield loss, because the present method compares delta values rather than an absolute value.

In a preferred embodiment of the method, the steps of selectively binning the integrated circuit include rejecting the integrated circuit as defective. Also preferably, the parameter being tested is a supply voltage, also called the VDD level. The steps of testing each of the functional blocks in the series are performed at a predetermined elevated or lowered temperature in one preferred embodiment of the method. It is also appreciated that the steps of testing each of the functional blocks in the series are, in another preferred embodiment, performed at a functional speed greater than a rated functional speed for the integrated circuit.

In another embodiment, all of the steps of the testing method are performed on a single testing device. In an alternate embodiment, the steps of testing each of the functional blocks in the series are performed on a testing device (on tester) and the steps of calculating, comparing, and selectively binning are performed on a separate analyzing device (off tester). The steps of selectively binning the integrated circuit may include burning in and retesting the integrated circuit.

According to another aspect of the invention an apparatus is described for accomplishing the method as described above. In yet another aspect of the invention a program is described for controlling a programmable apparatus to accomplish the method as described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
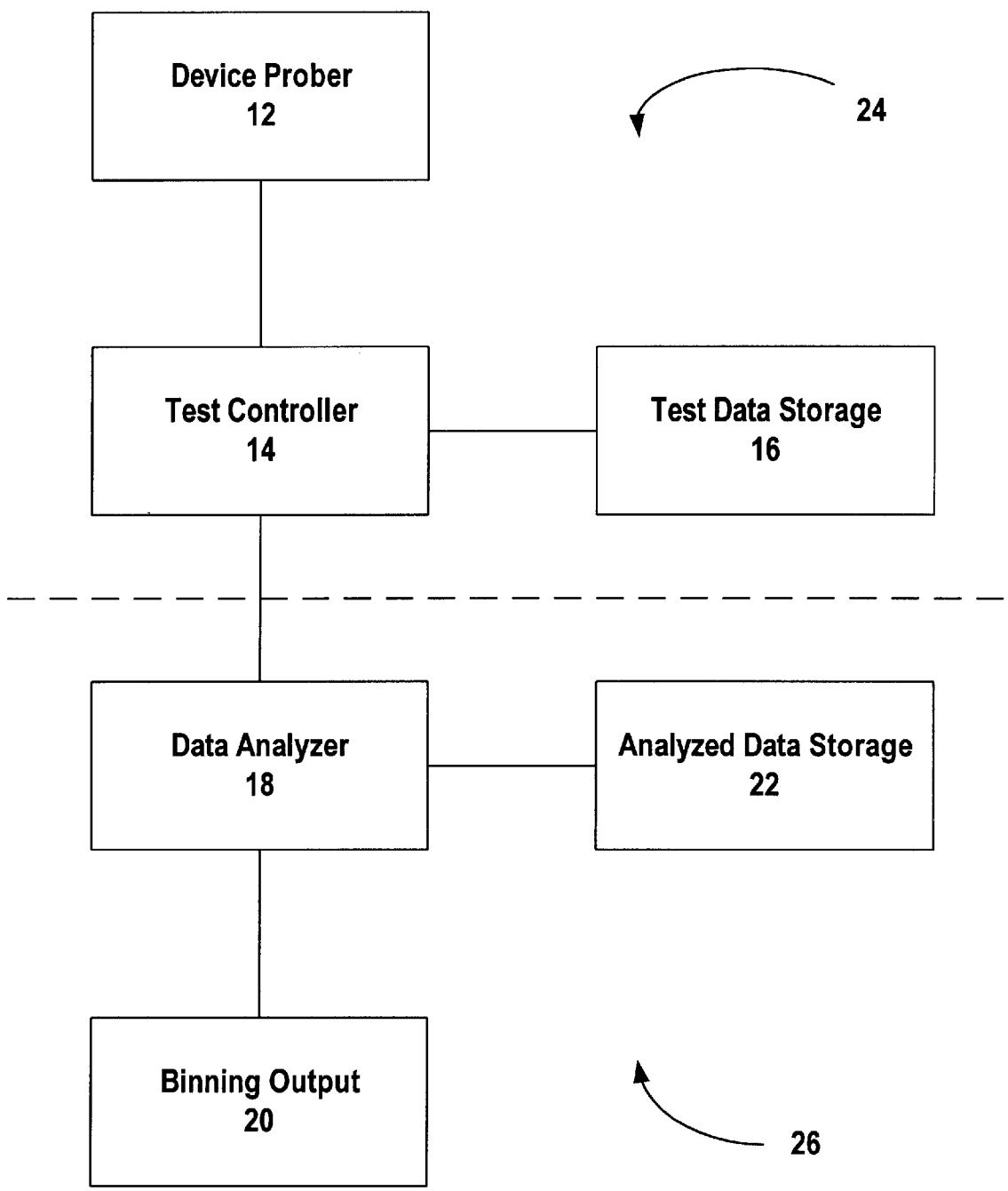
FIG. 1 is a functional block diagram of a device used for testing a series of functional blocks within an integrated circuit according to a preferred embodiment of the present invention.

Referring now to FIG. 1, there is depicted an apparatus 10 for testing a series of functional blocks within an integrated circuit for defects, including but not limited to resistive and delay defects, according to a preferred embodiment of the present invention. The apparatus 10 is comprised of a prober 12, such as a wafer prober or individual die tester, a test controller 14, a test data storage unit 16, a data analyzer 18, and a binning output 20. It is appreciated that the apparatus 10, as depicted in FIG. 1, and the elements of the apparatus 10 are representational. Thus, in an actual embodiment, there may be other elements that are desirable, which for the sake of clarity have been omitted.

The prober 12 depicted in FIG. 1 is preferably a component for electrically contacting an integrated circuit, such as for applying a voltage potential across the integrated circuit or inducing current through the integrated circuit, so that various tests may be performed on the integrated circuit. The test controller 14 is preferably a component for executing a computer program. The test controller 14 generally instructs the operation of the prober 12, sets input parameter levels, adjusts temperatures and speeds, and senses and collects test data generated during the execution of the test routine.

Preferably, the test data storage unit 16 records and stores the test data collected by the test controller 14. The data analyzer 18 depicted in FIG. 1 is preferably a processing device that calculates various parameters using the collected test data, and compares the raw test data, the parameters calculated from the test data, or both to test limits, whether those test limits be absolute limits or calculated limits. The data analyzer 18 may further compare the test data and calculated parameters to criteria input by a user. The binning output unit 20 receives and displays the results of the calculations and comparisons performed by the data analyzer 18. In an alternate embodiment, there may also be an analyzer data storage unit 22 component for reading, writing, and storing analyzed data from the data analyzer 18.

Figure 2:
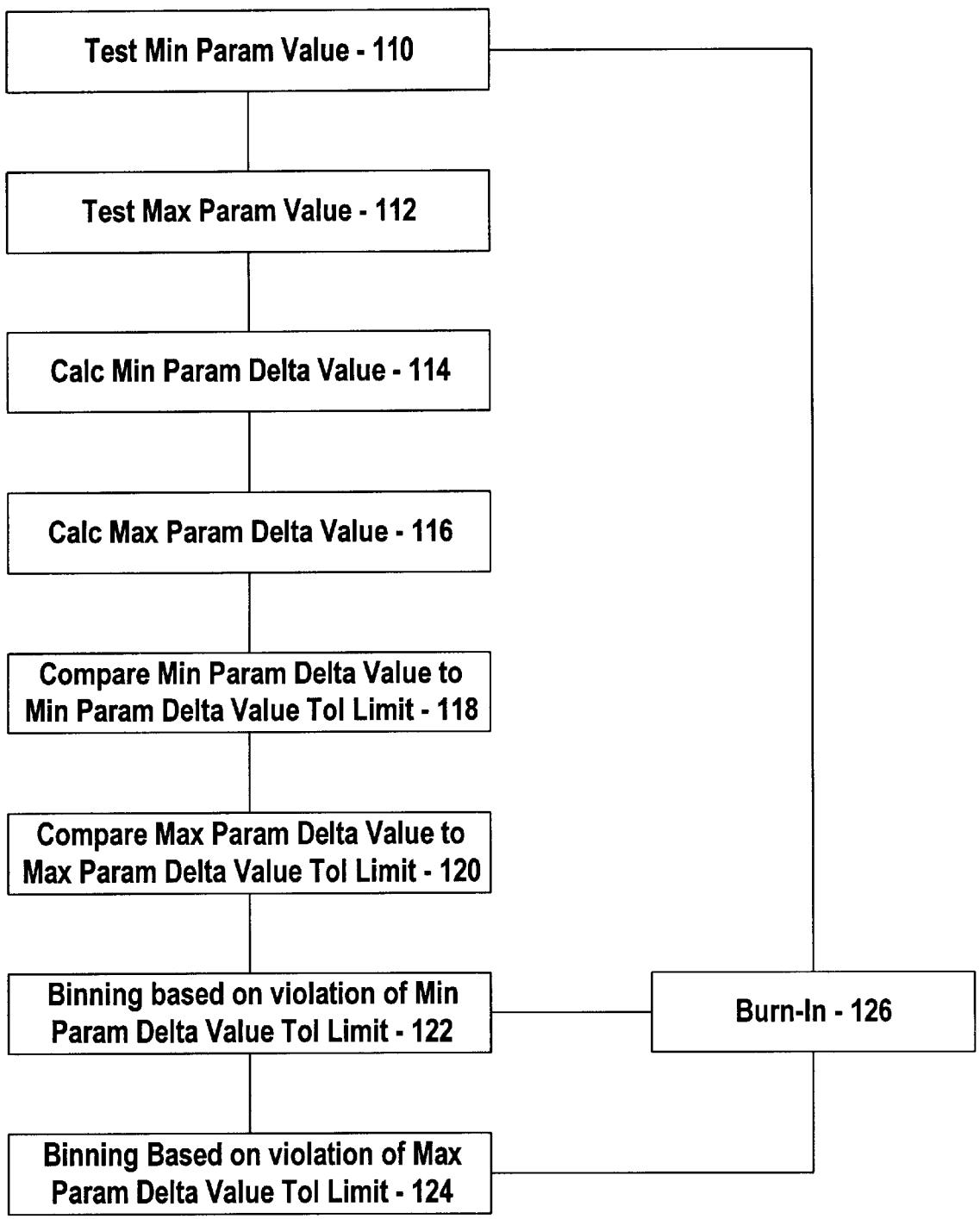
FIG. 2 is a flowchart of a method used for testing a series of functional blocks within an integrated circuit according to a preferred embodiment of the present invention.

Referring now to FIG. 2 there is depicted a flow chart 100 illustrating the preferred method for testing a series of functional blocks within an integrated circuit. It is appreciated that the method 100, as depicted in FIG. 2, is representational. Thus, in an actual embodiment, there may be additional process steps that are desirable, which for the sake of clarity have been omitted.

Each functional block in the series of functional blocks in the integrated circuit is tested to determine a minimum parameter value, as given in block 110. In so doing, the functional block under test is not merely tested for proper operation at a predetermined minimum parameter value, but rather is tested at decreasing values of the parameter until the functional block under test fails in some manner in its operation, as detected by the test controller 14. In one embodiment, as the parameter value is decreased down through an operable range, the highest parameter value at which the functional block under test is no longer operable is recorded as the minimum parameter value. In an alternate embodiment, the lowest parameter value at which the functional block under test continues to operate properly is recorded as the minimum parameter value.

Similar to that as described above, each functional block in the series of functional blocks in the integrated circuit is tested to determine a maximum parameter value, as given in block 112. In so doing, the functional block under test is not merely tested for proper operation at a predetermined maximum parameter value, but rather is tested at increasing values of the parameter until the functional block under test fails in some manner in its operation, as detected by the test controller 14. In one embodiment, as the parameter value is increased up through an operable range, the lowest parameter value at which the functional block under test is no longer operable is recorded as the maximum parameter value. In an alternate embodiment, the highest parameter value at which the functional block under test continues to operate properly is recorded as the maximum parameter value.

It is appreciated that the functional blocks may be tested for either the minimum parameter value first and then the maximum parameter value, or may alternately be tested for the maximum parameter value first and then the minimum parameter value. It is further appreciated that in a first embodiment all of the functional blocks may be tested for one of the parameters first, such as the maximum parameter value, and then all of the functional blocks may be tested for the other of the parameters, such as the minimum parameter value. In a second embodiment each functional block is tested for both the minimum parameter value and the maximum parameter value before moving on to the next functional block in the series.

It is further appreciated that there are many different permutations of the order in which the minimum parameter value and the maximum parameter value can be collected for all of the functional blocks in the series of the integrated circuit, and that a limitation to any specific one of the permutations is not intended to be a part of the present invention. Thus, it is appreciated that the guiding concept in this aspect is to be that both the minimum parameter value and the maximum parameter value is to be gathered for each of the functional blocks in the series, without regard to the order in which such data is gathered.

It is further appreciated that the data for more than a single parameter may be gathered at substantially the same time or during the same set of testing routines as the single parameter generally discussed herein. Thus, the invention is not limited to an embodiment where just a single parameter of the function blocks in the series is collected and analyzed. In a most preferred embodiment, the parameter is supply voltage, VDD.

In a most preferred embodiment, the steps of the method as described above are performed on a single piece of equipment, generally referred to as a tester, and generally indicated as 24 in FIG. 1, which is that portion of the apparatus 10 above the dashed line. Thus, it is appreciated that the apparatus 10 may or may not be a single piece of equipment, and may be several pieces of equipment. The various functional portions of the apparatus 10 may be connected by data communication lines, or may not be connected. In the latter embodiment, the data is communicated from one portion of the apparatus 10, such as the tester 24, to another portion of the apparatus 10, such as the analyzer 26, via a removable media, such as a disk which is written to and read from as needed by the various portions of the apparatus 10.

A minimum parameter delta value is calculated for each functional block in the series as given in block 114. The minimum parameter delta value for a given one of the functional blocks is the minimum parameter value for the given functional block subtracted from the minimum parameter value for a functional block immediately following the given functional block in the series. Similarly, a maximum parameter delta value is calculated for each functional block in the series, as given in block 116. The maximum parameter delta value for the given block is the maximum parameter value for the given functional block subtracted from the maximum parameter value for the functional block immediately following the given functional block in the series.

In this manner, data that is not normally gathered in the testing phase of integrated circuits is collected. Thus, the present method not only collects the limits of the parameter, being the minimum and maximum values, but also collects the delta values of the minimum and maximum values. In this manner the change in the value of the parameter is collected, as determined from a first functional block to a second functional block, and from the second functional block to a third functional block, and so on, preferably to the end of the series of functional blocks within the integrated circuit.

It is appreciated that the steps of the method as already described may not necessarily be performed in the order as given. For example, the step of calculating the minimum parameter delta value may be accomplished on tester immediately following the collection of the minimum parameter value from the functional blocks. Similarly, the step of calculating the maximum parameter delta value may be accomplished on tester immediately following the collection of the maximum parameter value from the functional blocks. In yet another embodiment, each functional block is tested for both the minimum parameter value and the maximum parameter value and then the delta values are calculated for the previous functional block before moving on to the subsequent functional block. However, most preferably all of the data collection is performed on tester, and then the data computation and analysis is performed as subsequent steps, most preferably off tester.

The minimum parameter delta value of a given functional block is compared to a minimum parameter delta value tolerance limit, as given in step 118. In one embodiment, the minimum parameter delta value tolerance limit is an absolute limit, meaning that the minimum parameter delta value tolerance limit is a set number that is determined prior to testing the functional blocks in the series of functional blocks in the integrated circuit. In this embodiment, the minimum parameter delta value tolerance limit is a predetermined specification limit. However, in a more preferred embodiment, the minimum parameter delta value tolerance limit is a statistically computed limit, that takes into account the distribution of the many minimum parameter values that have been collected. Thus, the minimum parameter delta value tolerance limit is preferably defined as being a value that is, for example, within a given multiple of the standard deviation from an average of the data collected.

Similarly, the maximum parameter delta value of a given functional block is compared to a maximum parameter delta value tolerance limit, as given in step 120. In one embodiment, the maximum parameter delta value tolerance limit is an absolute limit, meaning that the maximum parameter delta value tolerance limit is a set number that is determined prior to testing the functional blocks in the series of functional blocks in the integrated circuit. In this embodiment, the maximum parameter delta value tolerance limit is a predetermined specification limit. However, in a more preferred embodiment, the maximum parameter delta value tolerance limit is a statistically computed limit, that takes into account the distribution of the many maximum parameter values that have been collected. Thus, the maximum parameter delta value tolerance limit is preferably defined as being a value that is, for example, within a given multiple of the standard deviation from an average of the data collected.

The integrated circuit is selectively binned, based at least in part on whether the minimum parameter delta value for a given functional block violates the minimum parameter delta value tolerance limit, as given in step 122. If one or more of the minimum parameter delta values for the functional blocks within the integrated circuit violate the minimum parameter delta value tolerance limit, then the integrated circuit is binned in a manner which reflects that the minimum parameter delta value tolerance limit was violated. If the minimum parameter delta value for any functional block in the integrated circuit does not violate the minimum parameter delta value tolerance limit, then the integrated circuit is binned in a manner which reflects that the minimum parameter delta value tolerance limit was not violated.

If one or more of the minimum parameter delta values for the functional blocks within the integrated circuit violate the minimum parameter delta value tolerance limit, then the integrated circuit may be binned to receive remedial processing, such as the burn in as given in step 126. Subsequent to remedial processing, the integrated circuit is preferably retested according to the method as described above. In an alternate embodiment, if the minimum parameter delta value for any functional block of the integrated circuit violates the minimum parameter delta value tolerance limit, then the integrated circuit is rejected as defective.

Similarly, the integrated circuit is selectively binned, based at least in part on whether the maximum parameter delta value for a given functional block violates the maximum parameter delta value tolerance limit, as given in step 124. If one or more of the maximum parameter delta values for the functional blocks within the integrated circuit violates the maximum parameter delta value tolerance limit, then the integrated circuit is binned in a manner which reflects that the maximum parameter delta value tolerance limit was violated. If the maximum parameter delta value for any functional block in the integrated circuit does not violate the maximum parameter delta value tolerance limit, then the integrated circuit is binned in a manner which reflects that the maximum parameter delta value tolerance limit was not violated.

If one or more of the maximum parameter delta values for the functional blocks within the integrated circuit violate the maximum parameter delta value tolerance limit, then the integrated circuit may be binned to receive remedial processing, such as the burn in as given in step 126. Subsequent to remedial processing, the integrated circuit is preferably retested according to the method as described above. In an alternate embodiment, if the maximum parameter delta value for any functional block of the integrated circuit violates the maximum parameter delta value tolerance limit, then the integrated circuit is rejected as defective.

It is appreciated that the term "violated" as used above may have different meanings, all of which are fairly intuitive within the context of the term as used. For example, in the case of a minimum parameter tolerance limit, a violation of the tolerance limit preferably indicates that the measured parameter is either equal to or less than the tolerance limit, and thus the tolerance limit is violated. Similarly, in the case of a maximum parameter tolerance limit, a violation of the tolerance limit preferably indicates that the measured parameter is either equal to or greater than the tolerance limit, and thus the tolerance limit is violated.

It is appreciated that a program according to the present invention is preferably contained on a computer readable media, such as is known in the art, and has logic elements for enabling one or more programmable computing devices, such as a programmable tester and a personal computer, to test a series of functional blocks within an integrated circuit according to the method as described above.

In a further alternate embodiment, at least a portion of the method is implemented within the integrated circuit itself, such as in a built in self test (BIST) method, or DFT. In this embodiment, the integrated circuit itself contains the functionality required to test at least one of the minimum VDD delta values and the maximum VDD delta values for the functional blocks, and to preferably report the results of the tests. Alternately, the limits could also be programmed into the BIST or DFT.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for testing a series of functional blocks within an integrated circuit, the method comprising the steps of:
    testing each of the functional blocks in the series to determine a minimum parameter value associated with each of the functional blocks,
    calculating a minimum parameter delta value for each of the functional blocks in the series, where the minimum parameter delta value is the minimum parameter value associated with a given one of the functional blocks subtracted from the minimum parameter value for a functional block immediately following the given one of the functional blocks in the series,
    testing each of the functional blocks in the series to determine a maximum parameter value associated with each of the functional blocks,
    calculating a maximum parameter delta value for each of the functional blocks in the series, where the maximum parameter delta value is the maximum parameter value associated with the given one of the functional blocks subtracted from the maximum parameter value for the functional block immediately following the given one of the functional blocks in the series,
    comparing the minimum parameter delta value to a minimum parameter delta value tolerance limit,
    comparing the maximum parameter delta value to a maximum parameter delta value tolerance limit,
    selectively binning the integrated circuit based at least in part on whether the minimum parameter delta value for any of the functional blocks violates the minimum parameter delta value tolerance limit, and
    selectively binning the integrated circuit based at least in part on whether the maximum parameter delta value for any of the functional blocks violates the maximum parameter delta value tolerance limit.

2. The method of claim 1 wherein the minimum parameter delta value tolerance limit and the maximum parameter delta value tolerance limit are absolute limits.

3. The method of claim 1 wherein the minimum parameter delta value tolerance limit and the maximum parameter delta value tolerance limit are statistically calculated limits.

4. The method of claim 1 wherein the steps of selectively binning the integrated circuit includes rejecting the integrated circuit as defective.

5. The method of claim 1 wherein the parameter is a supply voltage.

6. The method of claim 1 wherein the steps of testing each of the functional blocks in the series are performed at a predetermined elevated temperature.

7. The method of claim 1 wherein the steps of testing each of the functional blocks in the series are performed at a functional speed greater than a rated functional speed for the integrated circuit.

8. The method of claim 1 wherein all of the steps are performed on a testing device.

9. The method of claim 1 wherein the steps of testing each of the functional blocks in the series are performed on a testing device and the steps of calculating, comparing, and selectively binning are performed on an analyzing device.

10. The method of claim 1 wherein the steps of selectively binning the integrated circuit include burning in and retesting the integrated circuit.

11. An apparatus for testing a series of functional blocks within an integrated circuit comprising:
    a tester for testing each of the functional blocks in the series to determine a minimum parameter value associated with each of the functional blocks,
    a calculator for calculating a minimum parameter delta value for each of the functional blocks in the series, where the minimum parameter delta value is the minimum parameter value associated with a given one of the functional blocks subtracted from the minimum parameter value for a functional block immediately following the given one of the functional blocks in the series,
    the tester further for testing each of the functional blocks in the series to determine a maximum parameter value associated with each of the functional blocks,
    the calculator further for calculating a maximum parameter delta value for each of the functional blocks in the series, where the maximum parameter delta value is the maximum parameter value associated with the given one of the functional blocks subtracted from the maximum parameter value for the functional block immediately following the given one of the functional blocks in the series,
    a comparator for comparing the minimum parameter delta value to a minimum parameter delta value tolerance limit,
    the comparator further for comparing the maximum parameter delta value to a maximum parameter delta value tolerance limit,
    a binner for selectively binning the integrated circuit based at least in part on whether the minimum parameter delta value for any of the functional blocks violates the minimum parameter delta value tolerance limit, and
    the binner further for selectively binning the integrated circuit based at least in part on whether the maximum parameter delta value for any of the functional blocks violates the maximum parameter delta value tolerance limit.

12. The apparatus of claim 11 wherein the minimum parameter delta value tolerance limit and the maximum parameter delta value tolerance limit are absolute limits.

13. The apparatus of claim 11 wherein the minimum parameter delta value tolerance limit and the maximum parameter delta value tolerance limit are statistically calculated limits.

14. The apparatus of claim 11 wherein the selective binning of the integrated circuit performed by the binner includes rejecting the integrated circuit as defective.

15. The apparatus of claim 11 wherein the parameter is a supply voltage.

16. A program on a computer readable media, the program having logic elements for enabling a programmable computing device to test a series of functional blocks within an integrated circuit, the program comprising:

a testing routine for testing each of the functional blocks in the series to determine a minimum parameter value associated with each of the functional blocks, a calculating routine for calculating a minimum parameter delta value for each of the functional blocks in the series, where the minimum parameter delta value is the minimum parameter value associated with the given one of the functional blocks subtracted from the minimum parameter value for a functional block immediately following the given one of the functional blocks in the series, the testing routine further for testing each of the functional blocks in the series to determine a maximum parameter value associated with each of the functional blocks, the calculating routine further for calculating a maximum parameter delta value for each of the functional blocks in the series, where the maximum parameter delta value is the maximum parameter value associated with the given one of the functional blocks subtracted from the maximum parameter value for a functional block immediately following the given one of the functional blocks in the series, a comparing routine for comparing the minimum parameter delta value to a minimum parameter delta value tolerance limit, the comparing routine further for comparing the maximum parameter delta value to a maximum parameter delta value tolerance limit, a binning routine for selectively binning the integrated circuit based at least in part on whether the minimum parameter delta value for any of the functional blocks violates the minimum parameter delta value tolerance limit, and the binning routine further for selectively binning the integrated circuit based at least in part on whether the maximum parameter delta value for any of the functional blocks violates the maximum parameter delta value tolerance limit.

17. The program of claim 16 wherein the minimum parameter delta value tolerance limit and the maximum parameter delta value tolerance limit are absolute limits.

18. The program of claim 16 wherein the minimum parameter delta value tolerance limit and the maximum parameter delta value tolerance limit are statistically calculated limits.

19. The program of claim 16 wherein the selective binning of the integrated circuit performed by the binning routine includes rejecting the integrated circuit as defective.

20. The program of claim 16 wherein the parameter is a supply voltage.

* * * * *